(12) United States Patent
Greco et al.

(10) Patent No.: US 11,594,568 B2
(45) Date of Patent: Feb. 28, 2023

(54) IMAGE SENSOR AND ELECTRONIC DEVICE

(71) Applicant: Sony Corporation, Tokyo (JP)

(72) Inventors: Tonino Greco, Stuttgart (DE); Klaus Zimmermann, Stuttgart (DE)

(73) Assignee: SONY CORPORATION, Tokyo (JP)

(*) Notice: Subject to any disclaimer, the term of this patent is extended or adjusted under 35 U.S.C. 154(b) by 29 days.

(21) Appl. No.: 16/961,268

(22) PCT Filed: Dec. 19, 2018

(86) PCT No.: PCT/EP2018/086017
§ 371 (c)(1),
(2) Date: Jul. 10, 2020

(87) PCT Pub. No.: WO2019/137778
PCT Pub. Date: Jul. 18, 2019

(65) Prior Publication Data
US 2021/0066384 A1 Mar. 4, 2021

(30) Foreign Application Priority Data
Jan. 10, 2018 (EP) ..................... 18150987

(51) Int. Cl.
*H01L 27/146* (2006.01)
*H01L 27/30* (2006.01)
*H01L 51/42* (2006.01)

(52) U.S. Cl.
CPC .. *H01L 27/14647* (2013.01); *H01L 27/14649* (2013.01); *H01L 27/307* (2013.01); *H01L 51/4213* (2013.01)

(58) Field of Classification Search
CPC ......... H01L 27/14647; H01L 27/14649; H01L 27/307; H01L 51/4213; H01L 27/1467;
(Continued)

(56) References Cited

U.S. PATENT DOCUMENTS

2016/0254403 A1* 9/2016 Guo .................. H01L 31/02
136/257
2016/0337605 A1* 11/2016 Ito ..................... H01L 27/14612
(Continued)

FOREIGN PATENT DOCUMENTS

CN 105428384 A 3/2016
EP 3243794 A1 11/2017
(Continued)

OTHER PUBLICATIONS

Diroll et al., "High-Temperature Photoluminescence of CsPbX3 (X=Cl, Br, I) Nanocrystals", 2017, Adv. Funct. Mater., 1606750, pp. 1-7 (Year: 2017).*

(Continued)

*Primary Examiner* — Samuel Park
(74) *Attorney, Agent, or Firm* — Xsensus LLP

(57) ABSTRACT

The present disclosure pertains to an image sensor, including: a first photosensitive layer (2) for sensing blue light; a second photosensitive layer (3) for sensing green light; a third photosensitive layer (4) for sensing red light; and a fourth photosensitive layer (5) for sensing infrared light, wherein the first, second, third and fourth photosensitive layer are stacked on each other and each comprise a Perovskite material.

19 Claims, 3 Drawing Sheets

(58) Field of Classification Search
CPC ... H01L 27/14652; Y02E 10/549; Y02P 70/50
See application file for complete search history.

(56) References Cited

U.S. PATENT DOCUMENTS

| | | |
|---|---|---|
| 2016/0366354 A1 | 12/2016 | Konstantatos et al. |
| 2017/0012404 A1* | 1/2017 | Xing .................. H01S 5/36 |
| 2017/0294607 A1* | 10/2017 | Kim .................. C07F 5/003 |
| 2017/0342316 A1 | 11/2017 | Luther et al. |
| 2018/0294315 A1 | 10/2018 | Shiomi et al. |
| 2019/0221742 A1* | 7/2019 | Li .................. H01L 51/5221 |
| 2019/0331525 A1* | 10/2019 | Peters .................. G01J 1/42 |
| 2020/0043672 A1* | 2/2020 | Mori .................. H01G 9/2022 |

FOREIGN PATENT DOCUMENTS

| | | | | |
|---|---|---|---|---|
| JP | 2019054142 A | * | 4/2019 | ........... H01G 9/2068 |
| WO | 2014/198625 A1 | | 12/2014 | |
| WO | 2016/014845 A1 | | 1/2016 | |
| WO | 2016/203724 A1 | | 12/2016 | |
| WO | 2017/061174 A1 | | 4/2017 | |
| WO | 2017/077523 A1 | | 5/2017 | |
| WO | WO-2018052372 A1 | * | 3/2018 | ............. H02S 50/15 |

OTHER PUBLICATIONS

International Search Report and Written Opinion dated Mar. 19, 2019 for PCT/EP2018/086017 filed on Dec. 19, 2018, 12 pages.

Gu et al., "3D Arrays of 1024-Pixel Image Sensors based on Lead Halide Perovskite Nanowires," Article in Advanced Materials, Nov. 2016, pp. 1-9.

Pierre, et al., "Solution-processed image sensors on flexible substrates," Flexible and Printed Electronics, IOP Publishing Ltd., Nov. 9, 2016, pp. 1-26.

* cited by examiner

IMAGE SENSOR AND ELECTRONIC DEVICE

CROSS-REFERENCE TO RELATED APPLICATIONS

The present application is based on PCT filing PCT/EP2018/086017, filed Dec. 19, 2018, which claims priority to EP 18150987.8, filed Jan. 10, 2018, the entire contents of each are incorporated herein by reference.

TECHNICAL FIELD

The present disclosure generally pertains to an image sensor and an electronic device with an image sensor.

TECHNICAL BACKGROUND

Generally, image sensors are known, which are typically semiconductor devices that convert an optical image (i.e. incident (image) light) into an electric signal. Known examples of image sensors include i.a. a charge coupled device (CCD) and a complementary metal-oxide-semiconductor (CMOS) image sensor.

Furthermore, active-pixel sensors (APS) are known which, generally, are implemented as an image sensor including an integrated circuit containing an array of pixel sensors, wherein each pixel, for example, contains a photodetector and an active amplifier.

Typically, CMOS sensors are less expensive than CCD sensors, but, generally it is known that the active circuitry in CMOS pixels occupies an area on the surface which is not light-sensitive and which reduces the quantum efficiency of the device, and thus also reduces the fill factor. It is known to address this issue by using backside illumination sensors.

For current conventional 3D integrated CMOS image sensors it is known to have a backside illumination structure which has a photo diode unit including photo diodes formed therein, and transfer gate transistors, which accordingly correspond to the photo diodes, a wiring line unit having transistors for signal processing and controlling, a color filter array (CFA), and a micro-lens array.

For achieving wavelength separation, a color filter array (CFA) may be employed, where RGB color filters are arranged on a square grid of sensor.

For a fixed number of pixels, it is generally known that the cost per image sensor may decrease by shrinking the pixel dimensions. However, the signal-to-noise ratio (SNR) and dynamic range of image sensors with small pixels may become limited. For this reason it is known that high performance image sensors have larger pixels, e.g. in the order of tens of micrometers in one dimension, while inexpensive and low performance imagers may have pixel dimensions of, e.g., approximately one micrometer.

In order to keep the image sensor resolution, one approach is to replace the color filter array. Another approach is to replace the photoactive material silicon, since silicon has a poor absorption coefficient.

Although there exist techniques for color filtering, it is generally desirable to provide an image sensor and an electronic device having a color filtering capability.

SUMMARY

According to a first aspect, the disclosure provides an image sensor, including a first photosensitive layer for sensing blue light; a second photosensitive layer for sensing green light; a third photosensitive layer for sensing red light; and a fourth photosensitive layer for sensing infrared light, wherein the first, second, third and fourth photosensitive layer are stacked on each other and each comprise a Perovskite material.

According to a second aspect, the disclosure provides an electronic device, including an image sensor; and a circuitry; wherein the image sensor includes: a first photosensitive layer for sensing blue light; a second photosensitive layer for sensing green light; a third photosensitive layer for sensing red light; and a fourth photosensitive layer for sensing infrared light, wherein the first, second, third and fourth photosensitive layer are stacked on each other and each comprise a Perovskite material.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

Figure 1:
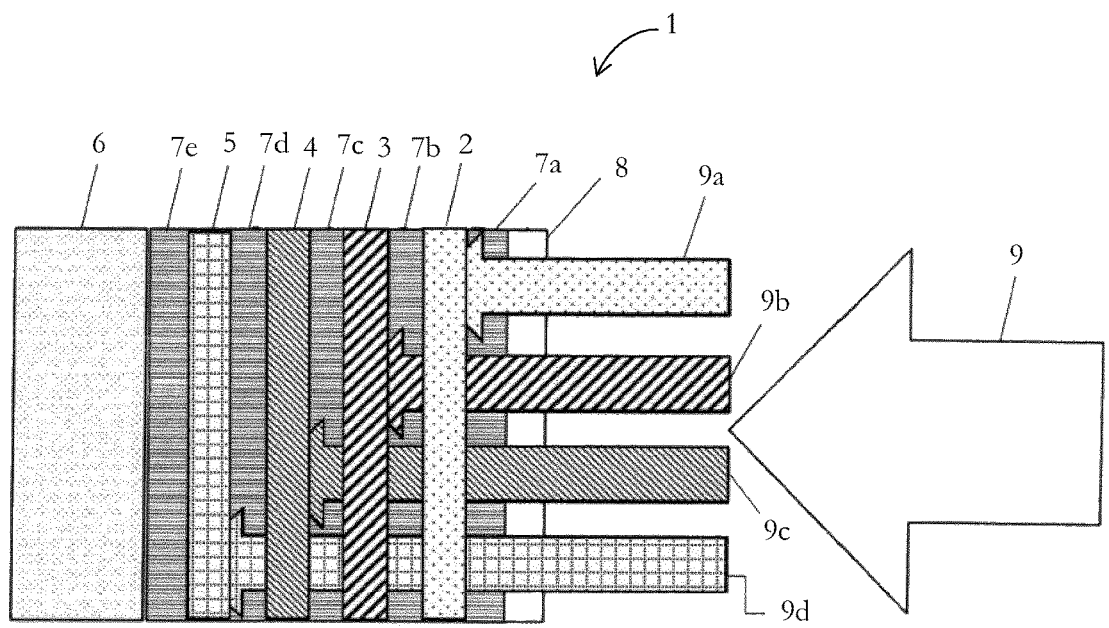
FIG. 1 illustrates a first embodiment of an image sensor.

Before a detailed description of the embodiments under reference of FIG. 1 is given, general explanations are made.

As mentioned in the outset, generally, image sensors are known, which are typically semiconductor devices that convert an optical image (i.e. incident (image) light) into an electric signal. Known examples of image sensors include i.a. a charge coupled device (CCD) and a complementary metal-oxide-semiconductor (CMOS) image sensor, to which, generally, also embodiments of the present disclosure pertain.

Furthermore, as mentioned, generally, active-pixel sensors (APS) are known, which are implemented as an image sensor including an integrated circuit containing an array of pixel sensors, wherein each pixel, for example, contains a photodetector and an active amplifier, and some embodiments are implement based on the known active-pixel sensor arrangement.

As discussed in the outset, for achieving wavelength separation, it is known to employ a color filter array (CFA), where RGB color filters are arranged on a square grid of sensor, which, however, may decrease image senor resolution.

It has been recognized that by using the generally known Perovskite material, an image sensor may be provided which provides color filtering and photo detection within the same material.

Thus, some embodiments, pertain to an image sensor including a first photosensitive layer for sensing blue light; a second photosensitive layer for sensing green light; a third photosensitive layer for sensing red light; and a fourth photosensitive layer for sensing infrared light, wherein the first, second, third and fourth photosensitive layer are stacked on each other and each comprise a Perovskite material.

Hence, the image sensor may have three vertically stacked photodiodes made of perovskite material, wherein, in some embodiments, the stacked photodiodes may be organized in a two-dimensional grid or array, as it is generally known.

The photosensitive layers are able to detect incident light by converting the light into a charge (e.g. an electron), based on the known principle of photo-conversion. The charges, which are generated by the incident light (photons) can be transported to a readout-circuitry, e.g. by associated charge transport layers.

Although in some embodiments, the first to fourth photosensitive layers are stacked in this order, i.e. the first, then the second, then the third, then the fourth photosensitive layer, the present disclosure is not limited in that regard, but also other orders of stacking are realized, e.g. from the fourth to the first photosensitive layer, or starting with the second, then the third, then the first and then the fourth, etc.

Therefore, in some embodiments, it is possible to omit a color filter array, such that, in some embodiments, a three times higher resolution can be achieved compared to the prior art where a color filter array is employed, or, a three times larger pixel size can be used in some embodiments resulting in a higher signal to noise ratio. Furthermore, the image sensor may have an optimized three-dimensional stacked structure, which allows the omission of additional color filters, since in some embodiments, the laminated Perovskite material films/layers are spectral region selective, as will also discussed further below. As mentioned, this may result in an up to three times higher pixel resolution compared to conventional CMOS based architectures including color filters. Moreover, the overall manufacturing process of the image sensor may be simplified and thereby costs may be reduced.

In some embodiments, the Perovskite material is processed based on wet-chemical printing methods, whereby, in some embodiments, production costs can be reduced.

Compared to silicon, the Perovskite material may have a much higher absorption coefficient due to the direct band gap. In some embodiments, the band gap of the Perovskite material is tunable by selecting an according composition such that the sensitivity can be tuned to a specific light wave range, e.g. blue, green, red, and (near) infrared.

In some embodiments, the image sensor is a (complementary) metal oxide semiconductor (C)MOS based image sensor or a charge-coupled device based sensor. The image sensor may also be of the backside illumination type, such that the incident light may not have to pass a circuitry layer.

Some embodiments are implemented as a three-dimensional integrated CMOS image sensor, which may also be of the backside illuminated type, wherein the readout-circuitry may be implemented according to the three-dimensional integrated CMOS technology.

In some embodiments, the image sensor is manufactured based on a semiconductor integrated circuit manufacturing technology including an image sensor manufacturing method. The image sensor may include a semiconductor substrate, an interlayer dielectric layer, contact electrodes for the four (or more) perovskite photoelectric films (layers) with passivation layers in-between and transparent interlayer electrodes.

In some embodiments, the implementation of perovskite layers enables the introduction of a photoelectric conversion unit as the image sensor discussed herein, which may be separated from other functional units made by conventional CMOS technology.

In some embodiments, the Perovskite material is based on the formula $ABX_3$, wherein the A is an inorganic alkali or an organic alkyl ammonium, B is a metal or a rare earth, and X is of the group of halogens. The A may be at least one of K, Rb, Cs, $CH_3NH_3$, $CH_3CH_2NH_3$, $CHN_2H_3$, the B may be at least one of Y, Zr, Hf, Sn, Ce, Tc, Al, SC, V, Cr, Mn, Fe, Co, Ga, Mg, Ni, Cu, Zn, Nb, and the X may be at least one of Cl, Br, I.

In some embodiments, the Perovskite material with the general formula $ABX_3$ has a band gab, which is tunable by the composition of the X-anions. The X-anions may be $Cl^-$, $Br^-$, $I^-$, and mixtures thereof. The A-cations may include or may consist of inorganic alkali cations $K^+$, $Rb^+$, $Cs^+$ or of organic alkyl ammonium cations, such as methyl or ethyl ammonium, and formamidinium: $CH_3NH_3^+$, $CH_3CH_2NH_3^+$, $CHN_2H_3^+$. Thus, in some embodiments, it is possible to generate a Perovskite material which selectively absorbs in a specific spectral region.

In some embodiments, a (semiconductor) charge transport layer is provided for each of the photosensitive layers. For instance, if the light incidents on the first photosensitive layer for sensing blue light, a charge transport layer may be provide after the first photosensitive layer in the direction of the incident light. At next, the second photosensitive layer is provided and then a (second) charge transport layer for the second photosensitive layer is provided (in the direction of the incident light). At next, the third photosensitive layer is provided and then a (third) charge transport layer for the third photosensitive layer is provided (in the direction of the incident light). At next, the fourth photosensitive layer is provided and a (fourth) charge transport layer for the fourth photosensitive layer is provided (in the direction of the incident light). Each of the associated charge transport layers transports charge (electrons, holes or both), which is generated by the associated photosensitive layer, e.g. to a readout circuitry.

The charge transport layer may include a metal oxide, such as $TiO_2$, NiO, $WO_3$, ZnO or the like.

In some embodiments, the image sensor further comprises a circuitry layer on which the photosensitive layers are stacked, wherein the circuitry layer may be a complementary metal oxide semiconductor circuitry layer.

Hence, some embodiments provide an image sensor, where photoelectric perovskite thin films act as photosensitive layers, which results in a type of light-sensitive device in which a conventional CMOS image sensor based on silicon photodiode is replaced by the image sensor described herein.

In some embodiments, the color filter and simultaneous photo sensing capability is achieved by stacking four different perovskite materials onto each other, each having a tuned band gap for a predefined spectral region, such that absorption is maximized in this predefined spectral region, i.e. blue light spectrum or spectral region, green light spectrum or spectral region, red light spectrum or spectral region, and (near) infrared light spectrum or spectral region, such that a color filter may be omitted and the color selection may be performed vertically. For instance, the first photosensitive layer may have a maximum sensitivity in the blue light spectrum (e.g. 450-495 nm), wherein the Perovskite material may include at least one of the following: $CsPbCl_2Br$, $CH_3NH_3CsPbCl_2Br$, $CHNHNH_2PbCl_2Br$. The second photosensitive layer may have maximum sensitivity in the green light spectrum (e.g. 495-570 nm), wherein the Perovskite material may include at least one of the following: $CsPbBr_3$, $CH_3NH_3CsPbBr_3$, or $Cs_{0.5}Rb_{0.5}PbBr_3$. The third photosensitive layer may have a maximum sensitivity in the red light spectrum (e.g. 620-750 nm), wherein the Perovskite material may include at least one of the following: $CsPbI_3$, $CH_3NH_3CsPbI_3$, $CH_3NH_3SnBr_{1.5}I_{1.5}$, $CsSnBr_{1.5}I_{1.5}$. The fourth photosensitive layer may have a maximum sensitivity in the (near) infrared light spectrum (e.g. 700 nm-1 mm, for near infrared, e.g. 740 nm-1400 nm), wherein the Perovskite material includes at least one of: $CH_3NH_3SnI_3$, $CsSnI_3$, $Cs_{0.5}Rb_{0.5}SnI_3$.

In some embodiments, the first to four perovskite layers are used to absorb the blue, green, red and infrared spectrum, wherein the first, second, third and fourth photosensitive layer are made of the same Perovskite material. In such embodiments, the light penetrates the Perovskite material, i.e. the photosensitive layers, in dependency on its wavelengths to different depths. Hence, the thickness of the layers is such configured that the light with blue wavelengths basically only penetrates the first photosensitive layer (i.e. the blue light is sensed in the first photosensitive layer), the green light basically only penetrates the first and the second photosensitive layer (i.e. the green light is sensed in the second photosensitive layer), the red light basically only penetrates the first, second and the third photosensitive layer (i.e. the red light is sensed in the third photosensitive layer) and the (near) infrared light basically penetrates the first, second, third and fourth photosensitive layer (i.e. the (near) infrared light is sensed in the fourth photosensitive layer). Of course, the sensing of the light in the spectrum may not be exclusively. For instance, the first photosensitive layer may also detected some amount of green, red and/or infrared light, the second photosensitive layer may also detect an amount of red and/or infrared light, etc. Moreover, some amount of the light may have a deeper penetration. For instance, an amount of blue light may also reach the second photosensitive layer (or even the third and/or fourth photosensitive layer), an amount of the green light may also reach the third photosensitive layer (and/or the fourth photosensitive layer), etc. But, the signals from the four photodiodes, i.e. four photosensitive layers, are such processed that data are obtained which provide the amounts of three additive primary colors, red, green, and blue and the amount of (near) infrared. For instance, the amount of "false" signals, e.g. of green, red and/or infrared light may be known in advance, based on a physical model describing the absorption efficiency for the first photosensitive layers (and the other photosensitive layers), etc.

Generally, also in such embodiments the four perovskite layers may be separated by a transparent insulating layer, preferably made of metal oxides, such as $TiO_2$, ZnO, Al:ZnO, Mg:ZnO or the like (as also discussed for the charge transport layer).

Moreover, in some embodiments, the photosensitive layers are in an order such that incident light first penetrates the first photosensitive layer, second the second photosensitive layer, third the third photosensitive layer, and fourth the fourth photosensitive layer.

Some embodiments pertain to an electronic device, wherein the electronic device includes an image sensor; and a circuitry; wherein the image sensor includes: a first photosensitive layer for sensing blue light; a second photosensitive layer for sensing green light; a third photosensitive layer for sensing red light; and a fourth photosensitive layer for sensing infrared light, wherein the first, second, third and fourth photosensitive layer are stacked on each other and each comprise a Perovskite material. The image sensor is an image sensor as discussed herein. The electronic device may be a camera (still and/or video), a mobile device (smartphone or the like), a tablet computer, a laptop computer, a desktop computer, etc. As discussed, the electronic device or image sensor may further comprise a circuitry layer on which the (first to four) photosensitive layers are stacked. In some embodiments, the circuitry layer is a complementary metal oxide semiconductor circuitry layer. As discussed, the Perovskite material may be based on the formula $ABX_3$, wherein the A is an inorganic alkali or an organic alkyl ammonium, B is a metal or a rare earth, and X is of the group of halogens.

Returning to FIG. 1, there is illustrated an image sensor 1, which has a first photosensitive layer 2, a second photosensitive layer 3, a third photosensitive layer 4, a fourth sensitive layer 5 and a CMOS circuitry layer 6, wherein the first to fourth photosensitive layers 2 to 5 are stacked on the CMOS circuitry layer 6.

Furthermore, five charge transport layers 7a to 7e are provided, such that each of the photosensitive layers 2 to 5 is sandwiched between two charge transport layers of the five charge transport layers 7a to 7e.

The first photosensitive layer 2 is sandwiched between the first charge transport layer 7a and the second charge transport layer 7b, the second photosensitive layer 3 is sandwiched between the second charge transport layer 7b and the third charge transport layer 7c, the third photosensitive layer 4 is sandwiched between the third charge transport layer 7c and the fourth charge transport layer 7d, and the fourth photosensitive layer 5 is sandwiched between the fourth charge transport layer 7d and the fifth charge transport layer 7e.

The charge transport layers 7a-7e are transparent and are made of a metal oxide, e.g. TiO, and they are a semiconductor.

The layers 2 to 5 and 7a to 7e are stacked on top of the CMOS circuitry layer 6 in the following order: fifth charge transport layer 7e, fourth photosensitive layer 5, fourth charge transport layer 7d, third photosensitive layer 4, third charge transport layer 7c, second photosensitive layer 3, second charge transport layer 7b, first photosensitive layer 2, first charge transport layer 7a and on top of the first charge transport layer 7a a transparent protection layer 8 is provided, which may be made of, e.g., glass, a metaloxide layer, e.g. ZnO, $Al_2O_3$, $SiO_2$ or the like.

Light 9 incidents on the top side, which is formed by the protection layer 8 and which is opposite to the CMOS circuitry layer 6 and penetrates the protection layer 8 and the first charge transport layer 7a.

Each of the photosensitive layers 2 to 5 is adapted to sense or detect a specific light spectrum.

The first photosensitive layer 2 is configured to sense the blue light spectrum, such as the blue light component 9a of the incident light 9, which has penetrated the protection layer 9 and the first charge transport layer 7a. As discussed, the first (blue) photosensitive layer 2 is made of, for example, the Perovskite material $CsPbCl_2Br$.

The second photosensitive layer 3 is configured to sense the green light spectrum, such as the green light component 9b of the incident light 9, which penetrates the first and second charge transport layers 7a and 7b and the first photosensitive layer 2. As discussed, the second (green) photosensitive layer is made of, for example, the Perovskite material $CsPbBr_3$.

The third photosensitive layer 4 is configured to sense the red light spectrum, such as the red light component 9c of the incident light 9, which penetrates the first and second charge transport layer 7a and 7b and the first photosensitive layer 2 as well as the second photosensitive layer 3 and the third charge transport layer 7c. As discussed, the third (red) photosensitive layer is made of, for example, the Perovskite material $CsPbI_3$.

The fourth photosensitive layer 5 is configured to sense the near infrared light spectrum, such as the infrared light component 9d of the incident light 9, which penetrates the first and second charge transport layer 7a and 7b, the first photosensitive layer 2, the second photosensitive layer 3, the third charge transport layer 7c, the third photosensitive layer 4 and the fourth charge transport layer 7d. As discussed, the fourth (near infrared) photosensitive layer is made of, for example, the Perovskite material $CH_3NH_3SnI_3$.

The charge transport layers 7a-7e transport charges, which are generated in the photosensitive layers 2, 3, 4 and 5 by the incident light, into the CMOS circuitry layer 6, where readout of the charges is performed, such that data signals representing the associated amount of blue, green, red and near infrared light are generated.

Figure 2:
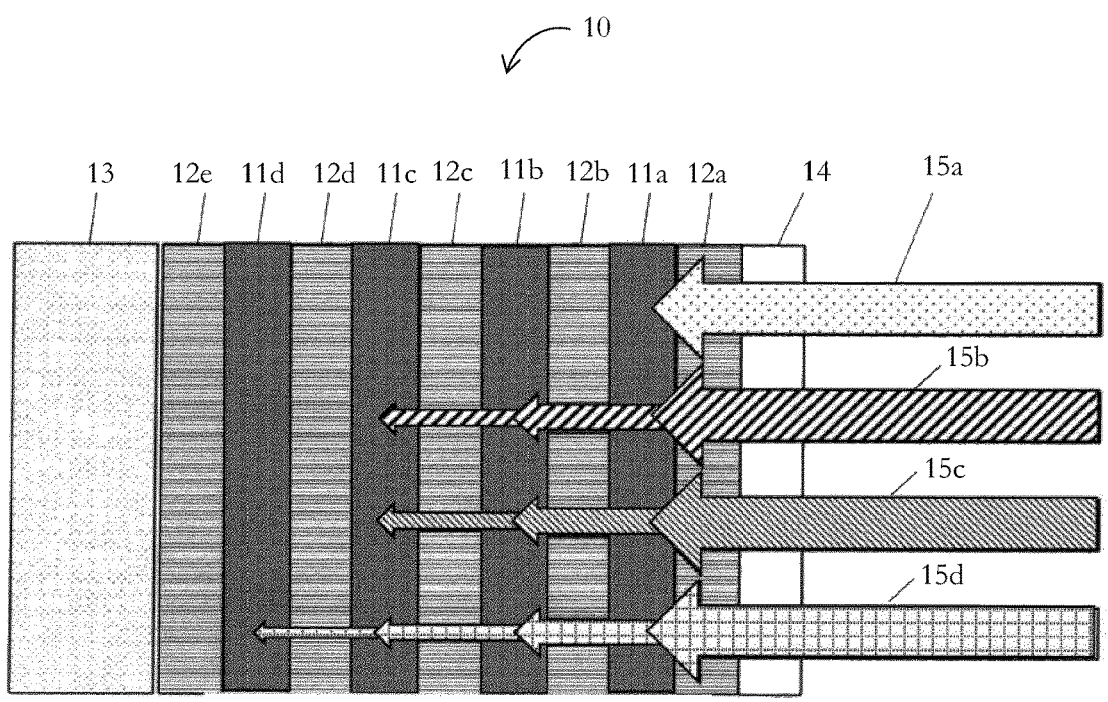
FIG. 2 illustrates a second embodiment of an image sensor.

In another embodiment, as illustrated in FIG. 2, an image sensor 10 has a four photosensitive layers 11a, 11b, 11c and 11d which are made of the same Perovskite material, such as $CH_3NH_3PbI_3$ and/or $CH_3NH_3SnI_3$, which is able to detect light in the blue, green, red and near infrared spectrum.

The four photosensitive layers 11a-d are each sandwiched between charge transport layers 12a-12e which are stacked together with the four photosensitive layers 11a-d on a CMOS circuitry layer 13.

The first photosensitive layer 11a is sandwiched between the first charge transport layer 12a and the second charge transport layer 12b, the second photosensitive layer 11b is sandwiched between the second charge transport layer 12b and the third charge transport layer 12c, the third photosensitive layer 11c is sandwiched between the third charge transport layer 12c and the fourth charge transport layer 12d, and the fourth photosensitive layer 11d is sandwiched between the fourth charge transport layer 12d and the fifth charge transport layer 12e.

The charge transport layers 12a-12e are transparent and are made of a metal oxide, e.g. TiO, and they are a semiconductor.

The layers 11a to 11d and 12a to 12e are stacked on top of the CMOS circuitry layer 13 in the following order: fifth charge transport layer 12e, fourth photosensitive layer 11d, fourth charge transport layer 12d, third photosensitive layer 11c, third charge transport layer 12c, second photosensitive layer 11b, second charge transport layer 12b, first photosensitive layer 11a, first charge transport layer 12a and on top of the first charge transport layer 12a a transparent protection layer 14 is provided, which may be made of, e.g., glass.

Light incidents on the top surface, i.e. the protection layer 14, and penetrates through the layers 11a-d and 12a-e, wherein FIG. 2 illustrates blue light 15a, green light 15b, red light 15c and near infrared light 15d travelling through the layers in the direction to the CMOS circuitry layer.

The first photosensitive layer detects or senses the blue light 15a, while the green 15b, the red 15c and the near infrared light 15d further penetrate the second charge transport layer 12b and penetrate the second photosensitive layer 11b which then detects or sense the green light 15b. The remaining light 15c and 15d further penetrates the third charge transport layer 12c and penetrates the third photosensitive layer 11c, which detects or senses the red light 15c. The near infrared light 15d further penetrates the fourth charge transport layer 12d and the fourth photosensitive layer 11d, which detects near infrared light.

Hence, the light components 15a-d penetrate the layers in dependence on the wavelength, and the longer the wavelength is the deeper the light travels through the layers, such that by providing the photosensitive layers 11a-d and the charge transport layers 12a to 12d with an suitable thickness, a color separation of the light components 15a-d can be achieved and, thus, the respective light components can be detected in the photosensitive layers, as described.

The charge transport layers 12a-12e transport charges, which are generated in the photosensitive layers 11a-d by the incident light 15a-d, into the CMOS circuitry layer 13, where readout of the charges is performed, such that data signals representing the associated amount of blue, green, red and near infrared light are generated.

Figure 3:
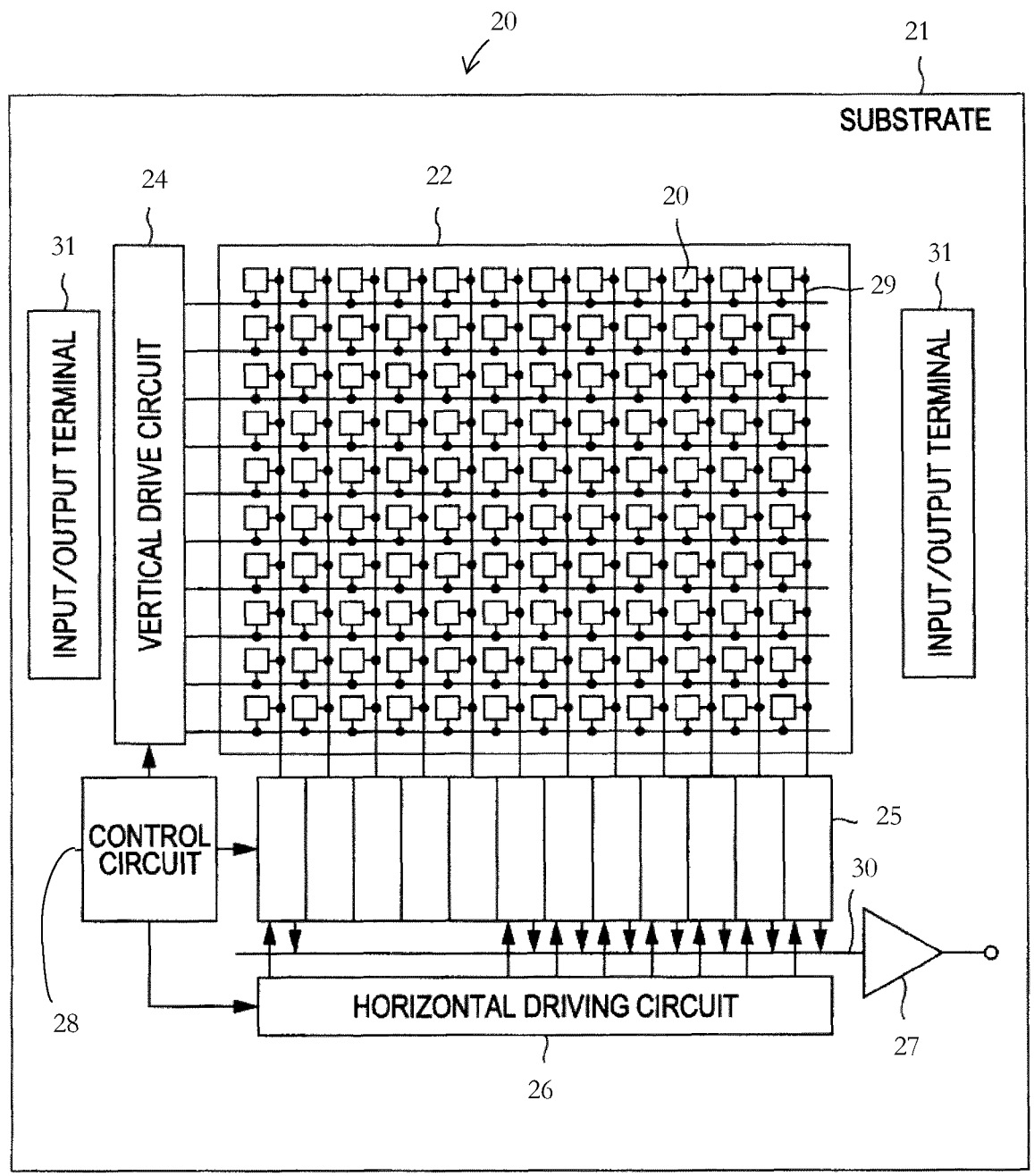
FIG. 3 illustrates an embodiment of an electronic device.

FIG. 3 is a schematic diagram illustrating an exemplary configuration of an electronic device 20, e.g. CMOS solid-state imaging device, which may use the photodiodes/image sensors as discussed herein, e.g. the image sensors 1 and 10, respectively, as discussed above under reference of FIG. 1 or 2.

The electronic device has a semiconductor substrate 21 on which a pixel section (pixel array) 3 is arranged, where a plurality of pixels 23 with photoelectric conversion parts are regularly placed on the silicon substrate 21, wherein the photoelectric conversion parts may be based on the image sensors described herein. For instance, each of the pixels 23 may have an image sensor as discussed in FIG. 1 or FIG. 2.

Each pixel 23 is one unit pixel, while in other embodiments, each pixel 23 or at least some pixels 23 have a shared pixel structure.

Furthermore, a peripheral circuitry section is provided which has a vertical drive circuit 24, a column signal processing circuit 25, a horizontal drive circuit 26, an output circuit 27, a control circuit 28, etc.

For instance, the control circuit 28 receives an input clock and data for the instruction of an operation mode, etc., and outputs information such as the internal information of the electronic device 20. The control circuit 28 generates signals, such as a clock signal and a control signal to be referenced for driving the vertical drive circuit 24, the column signal processing circuit 25, the horizontal drive circuit 26, etc., and inputs them accordingly to the associated circuits.

The vertical drive circuit 24 includes a shift register and drives pixels on a line by selecting a pixel-driving line and supplying a pulse for driving pixels to a selected pixel line. The vertical drive circuit 24 supplies a pixel signal to the column signal processing circuit 25. The pixel signal is based on electric charges generated according to the amount of light received by the pixels 23, wherein the electric charges are received through a vertical signal line 29.

The column signal processing circuit 25 is be provided for each column of the pixels 22 and performs signal processing on a signal which is output from each of the pixels 23. The output stage of the column signal processing circuit 25 is connected to a horizontal selection switch (not shown) which is located between the output stage and a horizontal signal line 30.

The horizontal drive circuit 26 outputs horizontal scanning pulses, selecting the respective column signal processing circuits 25 in order to output pixel signals thereof to the horizontal signal line 30.

The output circuit 27 performs signal processing of signals sequentially supplied from the respective column signal processing circuits 25 through the horizontal signal line 30 and then outputs the processed signals. An input/output terminal 31 performs an exchange of signals between the device and the outside.

Figure 4:
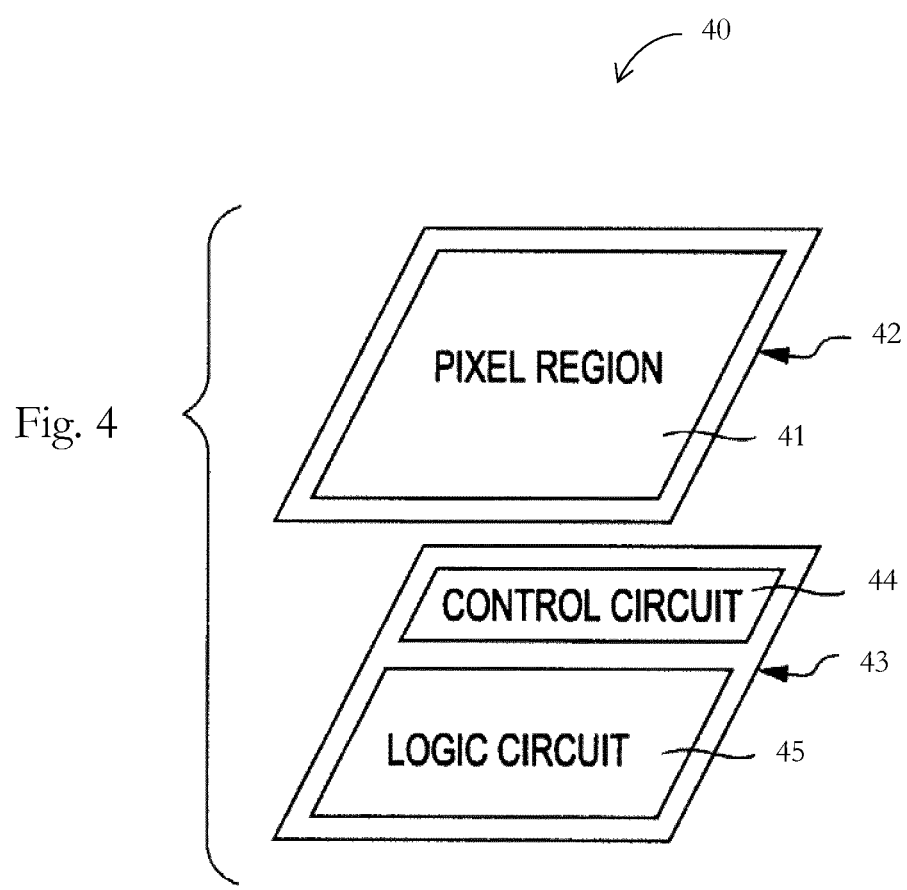
FIG. 4 illustrates an embodiment of an imaging device.

FIG. 4 illustrates an embodiment of an imaging device 40, which may use the image sensor 1 of FIG. 1 or image sensor 10 of FIG. 2 or any other image sensor as described herein, without limiting the present disclosure in that regard.

A pixel region 41 is arranged on a first semiconductor chip section 42. On a second semiconductor chip section 43, a control circuit 44 and a logic circuit 45 are mounted. The first semiconductor chip section 42 and the second semiconductor chip section 43 are electrically connected to each other to form a single semiconductor chip to provide the CMOS solid-state imaging device 40.

Note that the present technology can also be configured as described below.

(1) An image sensor, including:
    a first photosensitive layer for sensing blue light;
    a second photosensitive layer for sensing green light;
    a third photosensitive layer for sensing red light; and
    a fourth photosensitive layer for sensing infrared light,
wherein
    the first, second, third and fourth photosensitive layer are stacked on each other and each comprise a Perovskite material.
(2) The image sensor of (1), further including a circuitry layer on which the photosensitive layers are stacked.
(3) The image sensor of (2), wherein the circuitry layer is a complementary metal oxide semiconductor circuitry layer.
(4) The image sensor of anyone of (1) to (3), wherein the first photosensitive layer has a maximum sensitivity in the blue light spectrum.
(5) The image sensor of (4), wherein the Perovskite material includes at least one of the following: $CsPbCl_2Br$, $CH_3NH_3CsPbCl_2Br$, $CHNHNH_2PbCl_2Br$.
(6) The image sensor of anyone of (1) to (5), wherein the second photosensitive layer has maximum sensitivity in the green light spectrum.
(7) The image sensor of (6), wherein the Perovskite material includes at least one of the following: $CsPbBr_3$, $CH_3NH_3CsPbBr_3$, or $Cs_{0.5}Rb_{0.5}PbBr_3$.
(8) The image sensor of anyone of (1) to (7), wherein the third photosensitive layer has a maximum sensitivity in the red light spectrum.
(9) The image sensor of (8), wherein the Perovskite material includes at least one of the following: $CsPbI_3$, $CH_3NH_3CsPbI_3$, $CH_3NH_3SnBr_{1.5}I_{1.5}$, $CsSnBr_{1.5}I_{1.5}$.
(10) The image sensor of anyone of (1) to (9), wherein the fourth photosensitive layer has a maximum sensitivity in the infrared light spectrum.
(11) The image sensor of (10), wherein the Perovskite material includes at least one of: $CH_3NH_3SnI_3$, $CsSnI_3$, $Cs_{0.5}Rb_{0.5}SnI_3$.
(12) The image sensor of anyone of (1) to (11), wherein the photosensitive layers are in an order such that incident light first penetrates the first photosensitive layer, second the second photosensitive layer, third the third photosensitive layer, and fourth the fourth photosensitive layer.
(13) The image sensor of anyone of (1) to (12), wherein the first, second, third and fourth photosensitive layer are made of the same Perovskite material.
(14) The image sensor of anyone of (1) to (13), wherein the Perovskite material is based on the formula $ABX_3$, wherein the A is an inorganic alkali or an organic alkyl ammonium, B is a metal or a rare earth, and X is of the group of halogens.
(15) The image sensor of (14), wherein A is at least one of K, Rb, Cs, $CH_3NH_3$, $CH_3CH_2NH_3$, $CHN_2H_3$, B is at least one of T, Zr, Hf, Sn, Ce, Tc, Al, SC, V, Cr, Mn, Fe, Co, Ga, Mg, Ni, Cu, Zn, Nb, and X is at least one of Cl, Br, I.
(16) The image sensor of anyone of (1) to (15), wherein a charge transport layer is provided for each of the photosensitive layers.
(17) An electronic device, including:
    an image sensor; and
    a circuitry;
    wherein the image sensor includes:
    a first photosensitive layer for sensing blue light;
    a second photosensitive layer for sensing green light;
    a third photosensitive layer for sensing red light; and
    a fourth photosensitive layer for sensing infrared light,
wherein
    the first, second, third and fourth photosensitive layer are stacked on each other and each comprise a Perovskite material.
(18) The electronic device of (17), further including a circuitry layer on which the photosensitive layers are stacked.
(19) The electronic device of (18), wherein the circuitry layer is a complementary metal oxide semiconductor circuitry layer.
(20) The electronic device of anyone of (17) to (19), wherein the Perovskite material is based on the formula $ABX_3$, wherein the A is an inorganic alkali or an organic alkyl ammonium, B is a metal or a rare earth, and X is of the group of halogens.

The invention claimed is:
1. An image sensor, comprising:
    a plurality of layers including, in order from an incident light surface,
    a first photosensitive layer for sensing an amount of blue light;
    a first charge transport layer of a transparent metal oxide;
    a second photosensitive layer for sensing an amount of green light;
    a second charge transport layer of a transparent metal oxide;
    a third photosensitive layer for sensing an amount of red light;
    a third charge transport layer of a transparent metal oxide;
    a fourth photosensitive layer for sensing an amount of infrared light; and
    a fourth charge transport layer of a transparent metal oxide,
    wherein the first, second, third and fourth photosensitive layer are stacked on each other and each comprise a same Perovskite material with different thicknesses, wherein the image sensor outputs the amount of blue light, the amount of green light, the amount of red light, and the amount of infrared light.
2. The image sensor of claim 1, further comprising a circuitry layer on which the photosensitive layers are stacked.
3. The image sensor of claim 2, wherein the circuitry layer is a complementary metal oxide semiconductor circuitry layer.
4. The image sensor of claim 1, wherein the first photosensitive layer has a maximum sensitivity in the blue light spectrum.
5. The image sensor of claim 4, wherein the Perovskite material includes at least one of the following: $CsPbCl_2Br$, $CH_3NH_3CsPbCl_2Br$, $CHNHNH_2PbCl_2Br$.
6. The image sensor of claim 1, wherein the second photosensitive layer has maximum sensitivity in the green light spectrum.
7. The image sensor of claim 6, wherein the Perovskite material includes at least one of the following: $CsPbBr_3$, $CH_3NH_3CsPbBr_3$, or $Cs_{0.5}Rb_{0.5}PbBr_3$.
8. The image sensor of claim 1, wherein the third photosensitive layer has a maximum sensitivity in the red light spectrum.

9. The image sensor of claim 8, wherein the Perovskite material includes at least one of the following: $CsPbI_3$, $CH_3NH_3CsPbI_3$, $CH_3NH_3SnBr_{1.5}I_{1.5}$, $CsSnBr_{1.5}I_{1.5}$.

10. The image sensor of claim 1, wherein the fourth photosensitive layer has a maximum sensitivity in the infrared light spectrum.

11. The image sensor of claim 10, wherein the Perovskite material includes at least one of: $CH_3NH_3SnI_3$, $CsSnI_3$, $Cs_{0.5}Rb_{0.5}SnI_3$.

12. The image sensor of claim 1, wherein the photosensitive layers are in an order such that incident light first penetrates the first photosensitive layer, second the second photosensitive layer, third the third photosensitive layer, and fourth the fourth photosensitive layer.

13. The image sensor of claim 1, wherein the Perovskite material is based on the formula $ABX_3$, wherein the A is an inorganic alkali or an organic alkyl ammonium, B is a metal or a rare earth, and X is of the group of halogens.

14. The image sensor of claim 13, wherein A is at least one of K, Rb, Cs, $CH_3NH_3$, $CH_3 CH_2NH_3$, $CHN_2H_3$, B is at least one of Y, Zr, Hf, Sn, Ce, Tc, Al, Se, V, Cr, Mn, Fe, Co, Ga, Mg, Ni, Cu, Zn, Nb, and X is at least one of Cl, Br, I.

15. An electronic device, comprising:
an image sensor; and
a circuitry;
wherein the image sensor includes, in order from an incident light surface;
a first photosensitive layer for sensing an amount of blue light;
a first charge transport layer of a transparent metal oxide;
a second photosensitive layer for sensing an amount of green light;
a second charge transport layer of a transparent metal oxide;
a third photosensitive layer for sensing an amount of red light;
a third charge transport layer of a transparent metal oxide;
a fourth photosensitive layer for sensing an amount of infrared light; and
a fourth charge transport layer of a transparent metal oxide,
wherein the first, second, third and fourth photosensitive layer are stacked on each other and each comprise a same Perovskite material with different thicknesses, wherein the image sensor outputs the amount of blue light, the amount of green light, the amount of red light, and the amount of infrared light.

16. The electronic device of claim 15, further comprising a circuitry layer on which the photosensitive layers are stacked.

17. The electronic device of claim 16, wherein the circuitry layer is a complementary metal oxide semiconductor circuitry layer.

18. The electronic device of claim 15, wherein the Perovskite material is based on the formula $ABX_3$, wherein the A is an inorganic alkali or an organic alkyl ammonium, B is a metal or a rare earth, and X is of the group of halogens.

19. The electronic device of claim 15, wherein the circuitry is configured to remove false signals in amounts of blue light, green light, red light, and infrared sensed.

* * * * *